(12) United States Patent
Yu (10) Patent No.: US 9,572,245 B1
(45) Date of Patent: Feb. 14, 2017

(54) THERMAL CONDUCTING STRUCTURE APPLIED TO NETWORK CONTROL AUTOMATION SYSTEM

(71) Applicant: ADLINK TECHNOLOGY INC., New Taipei (TW)

(72) Inventor: Chia-Te Yu, New Taipei (TW)

(73) Assignee: ADLINK TECHNOLOGY INC., New Taipei (TW)

(*) Notice: Subject to any disclaimer, the term of this patent is extended or adjusted under 35 U.S.C. 154(b) by 0 days.

(21) Appl. No.: 14/844,479

(22) Filed: Sep. 3, 2015

(51) Int. Cl.
*H05K 7/20* (2006.01)
*H05K 1/02* (2006.01)

(52) U.S. Cl.
CPC .......... *H05K 1/0209* (2013.01); *H05K 7/2039* (2013.01)

(58) Field of Classification Search
CPC .............. H01L 2225/1094; H01L 2224/73253; H05K 1/0203
See application file for complete search history.

(56) References Cited

U.S. PATENT DOCUMENTS

| | | | | |
|---|---|---|---|---|
| 5,457,603 A * | 10/1995 | Leeb | .................. | H05K 7/20645 165/80.4 |
| 6,321,062 B1 * | 11/2001 | Kitano | .................... | C08L 83/04 399/330 |
| 6,430,052 B1 * | 8/2002 | Kordes | ................ | H05K 7/1461 165/185 |
| 6,532,154 B2 * | 3/2003 | Eady | ..................... | H05K 7/1424 257/727 |
| 7,974,093 B2 * | 7/2011 | Zeng | ................... | H05K 7/20545 165/104.33 |
| 2010/0320187 A1 * | 12/2010 | Griffin | ................... | H01L 23/345 219/209 |

* cited by examiner

Primary Examiner — Robert J Hoffberg
Assistant Examiner — Hung Dang
(74) Attorney, Agent, or Firm — Muncy, Geissler, Olds & Lowe, P.C.

(57) ABSTRACT

The present disclosure provides a thermal conducting structure applied to a network control automation system. A circuit board defines bare copper regions located at two opposite sides thereof, and copper foil layers are disposed on bare copper regions and cover sliding edges on two side panels to form a thermal conducting path. An accommodation open chamber is formed between outer shell member and two side panels thereof for positioning circuit board, the two side panels of outer shell member have elastic convex parts disposed on surfaces thereof. The circuit module cooperating with positioning structure can be inserted into docking chamber by slidably mounting sliding edge along mounting part from opening, and elastic convex parts are abutted with sidewall around mounting parts to form thermal conducting path, so that heat generated during operation can be conducted to cooler bracket thereby increasing entire heat dissipation area and further improving heat dissipation efficiency.

10 Claims, 8 Drawing Sheets

FIG.8

THERMAL CONDUCTING STRUCTURE APPLIED TO NETWORK CONTROL AUTOMATION SYSTEM

BACKGROUND OF THE INVENTION

1. Field of the Invention

The present disclosure relates to a thermal conducting structure applied to a network control automation system, more particularly to a thermal conducting structure capable of conducting the heat generated during operation of the heat source of the circuit module to a cooler bracket for heat dissipation via copper foil layers located at two opposite side ends of the circuit board in cooperation with the positioning structure, so as to improve overall heat dissipation efficiency.

2. Description of the Related Art

With the rapid development of electronic technology, computers, laptops and other computer equipment are ubiquitous in every corner of society, and their development trend towards high computing power, fast speed and small size. However, with open framework of the computer equipment, standardization of software and hardware and continuous expansion and upgrading in functions, manufacturers start to develop industrial computers used in different professional fields including applications of industrial control, industrial automation, network and communication equipment, machine vision, intelligent transport system, and so on. Moreover, the industrial computers also can be used in military, transportation, aerospace field or other industrial applications which are required for high reliability and stability, thereby satisfying customer's requirements for particular specification and various high-efficiency operations in the severe environment.

Further, because the information industry progresses continually and network communication technology boosts, a new generation industrial automation equipment based on an instant communication interface develops quickly and vigorously. A servo control technology used by traditional automation equipment and machine platform has problems, such as poor multi-shaft synchronous and instant performance, insufficient resolution, restriction due to numerous wires, and noise interference, etc. Therefore, serial servo control technologies which can utilize the instant communication system to transfer digital signals and control parameters via a network media and be applied for various transfer communication protocols used by industrial automatic control systems, are provided in recent years. For example, the EtherCAT is a new open-ended technology, a fieldbus technology based on Ethernet network architecture, and also a distributed I/O system having high performance. The EtherCAT technology has advantages in easy wiring, cost saving, anti-interference and remote control, and also has potential in developing a motion control technology having higher speed and high precision, so that the EtherCAT and the motion control technology can be integrated as a distributed control servo drive system to replace a large single control system. However, because of development trend of the industrial automatic control system towards smaller size and higher speed, a temperature of the FPGA chip, the CPU, the chipset, the image processor or other heat source on a circuit board will also be greatly raised. Therefore, an important issue for stabilization of industrial automatic control system is how to ensure that the system can be operated normally at a permissive temperature and its overall heat dissipation efficiency can be improved. The important issue has been regarded as a problem to be solved effectively by people who engage in this industry.

SUMMARY OF THE INVENTION

The present invention has been accomplished under the circumstances in view. It is therefore the main object of the present invention to provide a thermal conducting structure including a circuit module, a positioning structure and a cooler bracket. A circuit board of the circuit module has at least one heat source, and the circuit board defines bare copper regions disposed at two opposite side ends thereof, and copper foil layers are disposed on the bare copper regions and covered with sliding edges of track members located at two side panels of an outer shell member of the positioning structure to form a thermal conducting path. An accommodation open chamber is formed between the outer shell member and the side panels thereof to receive and position the circuit board therein, and each of the two side panels of the outer shell member defines at least one elastic convex part on a surface thereof. Through the opening of the cooler bracket, the circuit module in cooperation with the positioning structure can be inserted into a docking chamber by using the sliding edge of the track member to slidably mount along the mounting part, and the elastic convex parts can be abutted with the sidewalls of the docking chamber around the mounting part to form the thermal conducting path, so that heat generated during operation of the heat source of the circuit board can be conducted to the cooler bracket through the copper foil layer in cooperation with the positioning structure, and the entire heat dissipation area can be increased and better overall heat dissipation efficiency can be achieved.

According to an aspect of the present disclosure, when the circuit module engaged with the positioning structure is assembled with the cooler bracket, the sliding edges of the track members at top and bottom sides of the outer shell member are respectively slidably mounted along the track slots of the mounting parts first, and the spring clips of the elastic convex parts are respectively abutted with the stop blocks around the track slot to have inwardly elastic deformation. After the outer shell member is inserted and fastened, an about 0.1 mm of predetermined constraint value is formed between the spring clip and the stop block. In shaping process of the main body of the cooler bracket, in order to separate the workpiece from the mold more easily, a predetermined certain allowance (such as draft angle) between the workpiece and a die parting face of the mold is often reserved. Therefore, the elastic convex parts abutted with the track members of the cooler bracket can form tight contacts to facilitate heat conduction.

According to other aspect of the present disclosure, during the assembly of the circuit module and the positioning structure, the copper foil layers of the circuit board are slidably mounted along the sliding slots inside the sliding edges of the track members, and the outer shell member is pushed to inwardly move relative to the circuit board, so as to fasten the circuit board in the accommodation open chamber. Thereafter, when the punches of the lugs at two opposite sides of the sliding edges correspond to the mounting holes of the copper foil layers respectively, the fixing elements are penetrated through the punches of the lugs and the mounting holes of the copper foil layers to ensure that the outer shell member and the circuit board are combined stably. The bent structures of the sliding edges of the track members for covering the copper foil layers can enhance the structural strength of the circuit board, and protect the circuit module from being easily deformed or broken in structure According to other aspect of the present disclosure, when the circuit module in cooperation with the positioning structure are assembled in the docking chamber of the cooler bracket, the outer shell member of the positioning structure is used to cover the heat source and other electronic component s of the circuit board of the circuit module for protection. In addition, it is hard to limit the strength and direction of user's force during plugging connection of the circuit module, the outer shell member of the positioning structure can prevent the multiple sets of the circuit modules from being damaged or broken because of being impacted with each other. Therefore, the thermal conducting structure of the present disclosure can have nice practicability.

BRIEF DESCRIPTION OF THE DRAWINGS

The detailed structure, operating principle and effects of the present disclosure will now be described in more details hereinafter with reference to the accompanying drawings that show various embodiments of the present disclosure as follows.

DETAILED DESCRIPTION OF THE PREFERRED EMBODIMENTS

Reference will now be made in detail to the exemplary embodiments of the present disclosure, examples of which are illustrated in the accompanying drawings. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. These embodiments are provided so that this disclosure will be thorough and complete, and will fully convey the inventive concept to those skilled in the art. The relative proportions and ratios of elements in the drawings may be exaggerated or diminished in size for the sake of clarity and convenience in the drawings, and such arbitrary proportions are only illustrative and not limiting in any way. The same reference numbers are used in the drawings and the description to refer to the same or like parts.

It will be understood that, although the terms 'first', 'second', 'third', etc., may be used herein to describe various elements, these elements should not be limited by these terms. The terms are used only for the purpose of distinguishing one component from another component. Thus, a first element discussed below could be termed a second element without departing from the teachings of embodiments. As used herein, the term "or" includes any and all combinations of one or more of the associated listed items.

Please refer to FIG. 1 through FIG. 4 which show an elevational view and an exploded view of the preferred embodiment, and elevational views of a circuit module and a positioning structure before assembly and after assembly, respectively. As shown in FIGs, the thermal conducting structure includes a circuit module 1, a positioning structure 2 and a cooler bracket 3.

The circuit module 1 includes a multiple-layered circuit board 11, and at least one heat source 111 is disposed on one or two side surfaces of the circuit board 11. Preferably, the heat source 111 can be a FPGA chip; alternatively, in actual applications, the heat source 111 can be a CPU, chip set (such as ICH, RAM and so on), or an image processor (such as GMCH). The circuit board 11 defines bare copper regions 110 at terminals of top and bottom sides thereof, and is provided with copper foil layers 12 respectively disposed along a horizontal direction on the bare copper regions 110 of the top and bottom sides of the circuit board 11. The copper foil layers 12 and multiple metal interlayers inside the circuit panel 11 form a thermal conducting path to facilitate the heat generated during operation of the heat source 111 to be conducted to the copper foil layers 12 via the circuit board 11. The circuit board 11 further defines a plurality of mounting holes 121 cut through the copper foil layers 12 at corners thereof.

Further, the circuit board 11 has plurality of ports 112 at a front part thereof. The port 112 can be a power connector, a network connector (such as RJ45) or other connector matching with other transmission interface specification. The circuit board 11 includes an insertion part 113 (such as a plurality of metal contacts) disposed along a vertical direction at a rear end thereof and a panel 13 disposed at the front part thereof. The panel 13 defines a plurality of hollow parts 131 cut therethrough and used to expose the ports 112. The panel 13 includes two manual screws 132 disposed at top and bottom sides thereof, so that the circuit board 11 can be constructed as a network interface card or a serial transmission card matching with the Ethernet network based fieldbus technology or other communication protocol.

The positioning structure 2 includes an outer shell member 21 which defines two opposite side panels 211 at up and bottom sides thereof. Each of the side panels 211 defines a sliding edge 221 of the track member 22. Each sliding edge 221 is formed by being extended outwardly first and then bent inwardly. Each sliding edge 221 defines a sliding slot 222 extended along a horizontal direction therein. An accommodation open chamber 20 through front-to-rear is formed between the outer shell member 21 and the side panels 211. The sliding edge 221 further defines lugs 223 respectively located at front and rear openings of the sliding slots 222 and extended outwardly, and each lug 223 has a punch 224. A nut 2252 is disposed in the punch 224 and can be inserted by and locked with a screw 2251 of a fixing element 225. Alternatively, the nut 2252 can be directly welded and fastened on the copper foil layer 12, and aligned with the mounting hole 121 at the corner of the circuit panel 11, to facilitate the screw 2251 to be locked into the nut 2252. Each of the two side panels 211 of the outer shell member 21 defines an elastic convex part 23 having at least one arch spring clip 231. Each of the spring clips 231 has a high-to-low smooth top surface 2311, and the top surface 2311 defines two connection parts 2312 at front and rear sides thereof adjacent to the side panel 211, and cut holes 230 located at right and left lateral sides thereof.

Figure 6:
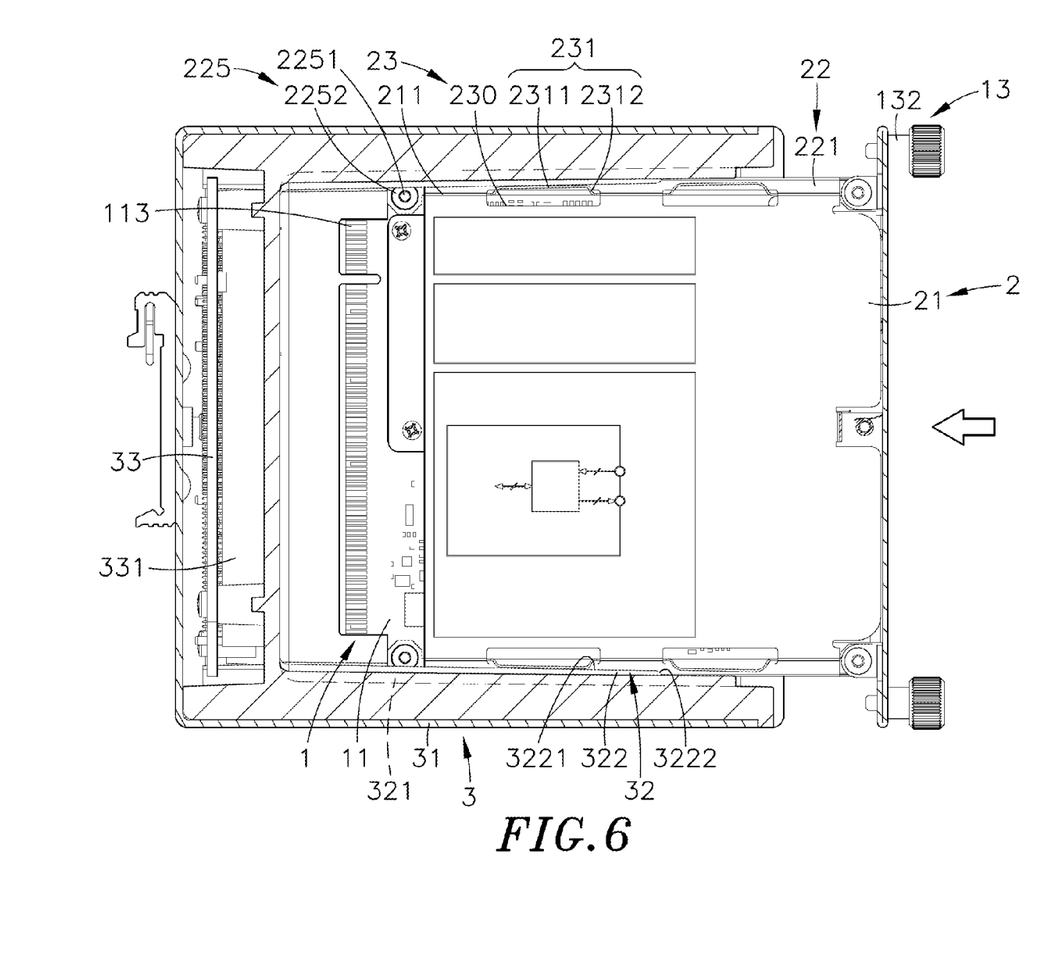
FIG. 6 is a sectional side view of the preferred embodiment of the present disclosure, illustrating the circuit module inserting into the cooler bracket.

The cooler bracket 3 has a main body 31 in chassis shape. The main body 31 defines a docking chamber 30 with an opening 301 at the front end thereof, and has a plurality of thread holes 311 arranged in intervals at top and bottom sides around the opening 301. The main body 31 defines a plurality of mounting part 32 located in intervals at top and bottom sidewall of the docking chamber 30 and backwardly extended from the opening 301 along a horizontal direction, and each of the mounting parts 32 has a track slot 321, and a protruding stop block 322 is disposed at the bottom sidewall between two adjacent track slots 321. The stop block 322 defines a low-to-high smooth contact surface on a top surface thereof, and a chamfer 3222 is formed at a front part of the each of contact surfaces 3221 adjacent to the opening 301. A wire board 33 (as shown in FIG. 6 and FIG. 7) is disposed at the rear of the docking chamber 30 of the main body 31, and at least one connection element (such as a socket) 331 is disposed on the wire board 33.

In a preferred implementation, the positioning structure 2 is made of copper, iron or steel material integrally, and the structures of the outer shell member 21, the track member 22, and the elastic convex part 23 are formed by manners of mechanically punching press and bending. In the actual application, the positioning structure 2 is made of aluminum material integrally, and the outer shell member 21 is in a formation of a frame panel; alternatively, a plurality of standing fins can be formed on the surface of the outer shell member 21 by an aluminum extrusion process, so as to increase the surface area for heat dissipation. The cooler bracket 3 can also be made of copper or aluminum material integrally, or a plurality of panels are made separately and then assembled integrally to form the cooler bracket 3. The docking chamber 30 is formed inside the main body 31 and has the plurality of mounting parts 32 at top and bottom sidewalls thereof. There are various manners for assembling and forming the outer shell member 21 of the positioning structure 2 and the main body 31 of the cooler bracket 3, so their designs can be changed according to the actual application. The details of structure are not the inventive features of the present disclosure, so the detailed description is omitted.

Figure 1:
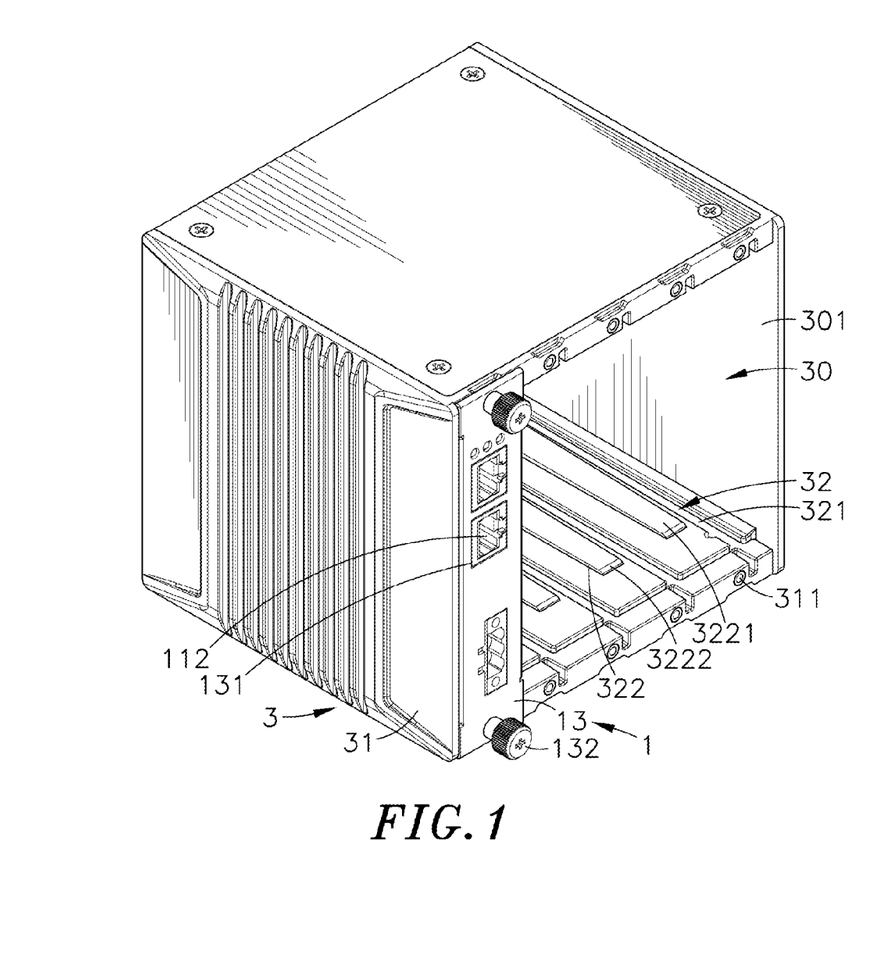
FIG. 1 is an elevational view of a preferred embodiment of the present disclosure.
Figure 2:
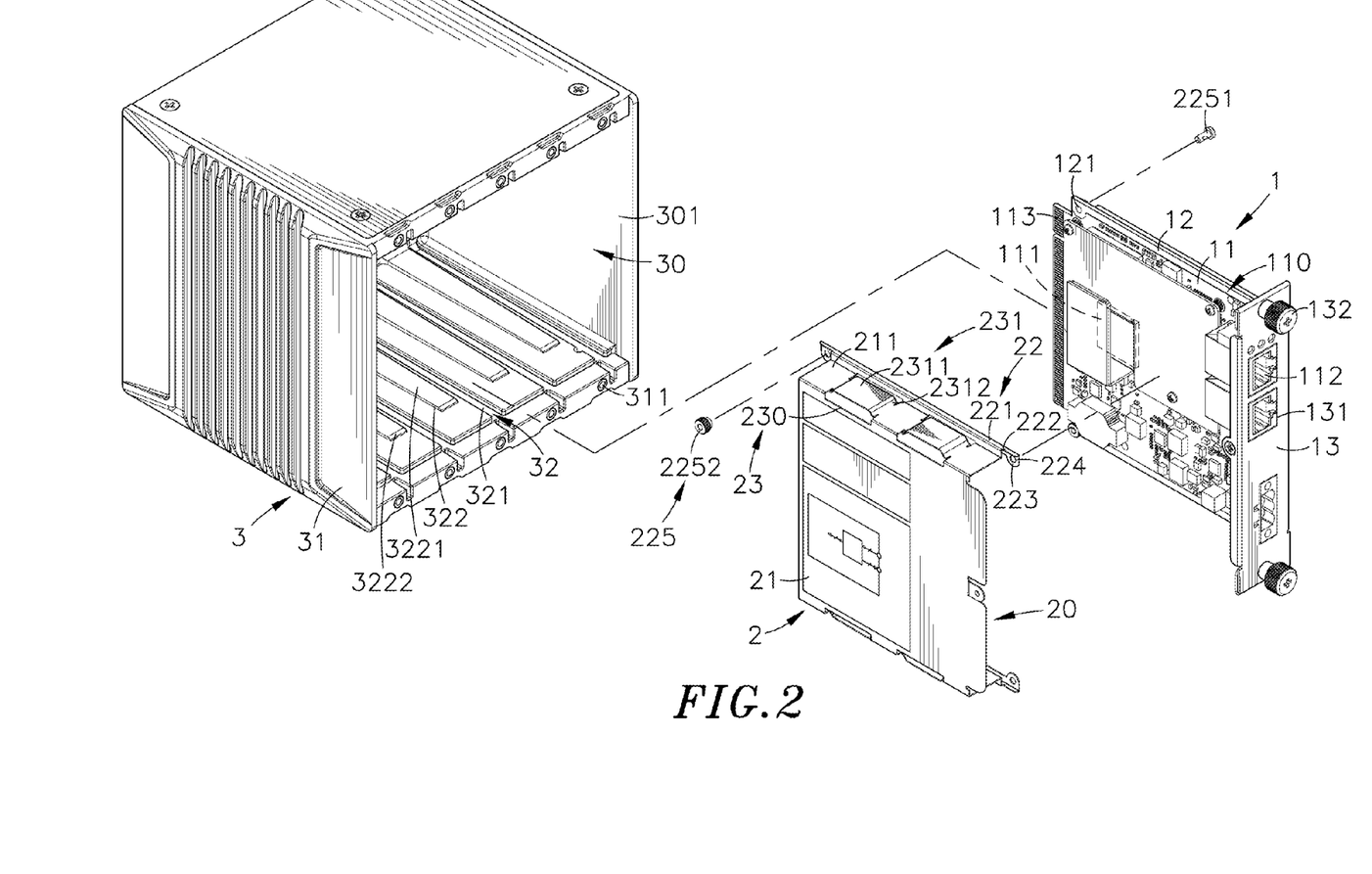
FIG. 2 is an exploded view of the preferred embodiment of the present disclosure.
Figure 3:
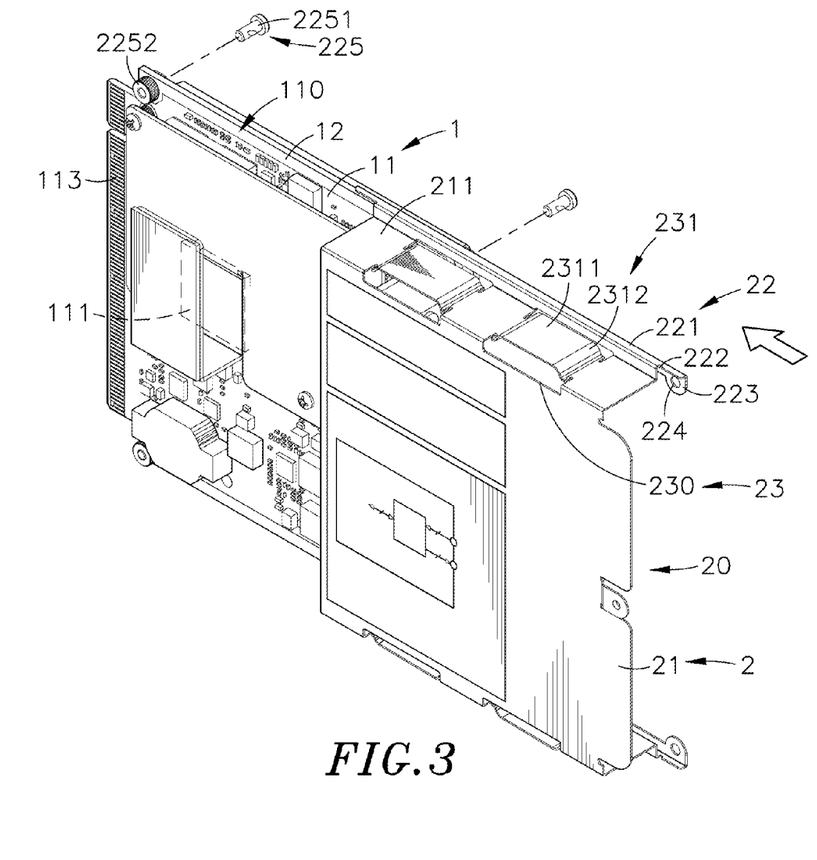
FIG. 3 is an elevational view of a circuit module and a positioning structure of the present disclosure before assembly.
Figure 4:
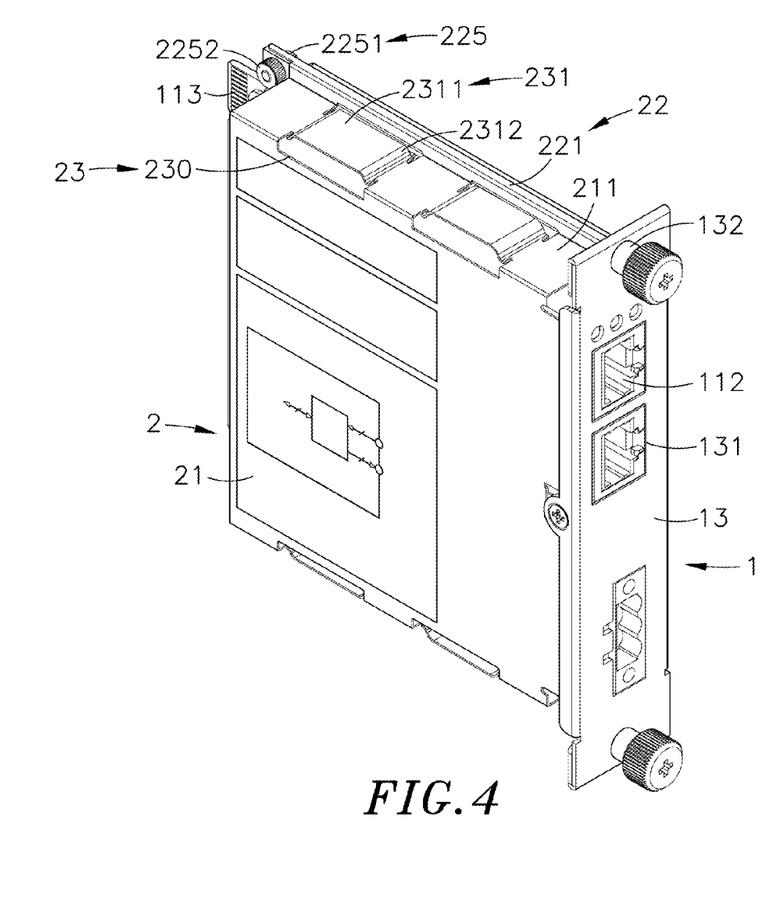
FIG. 4 is an elevational view of the circuit module and the positioning structure of the present disclosure after assembly.
Figure 5:
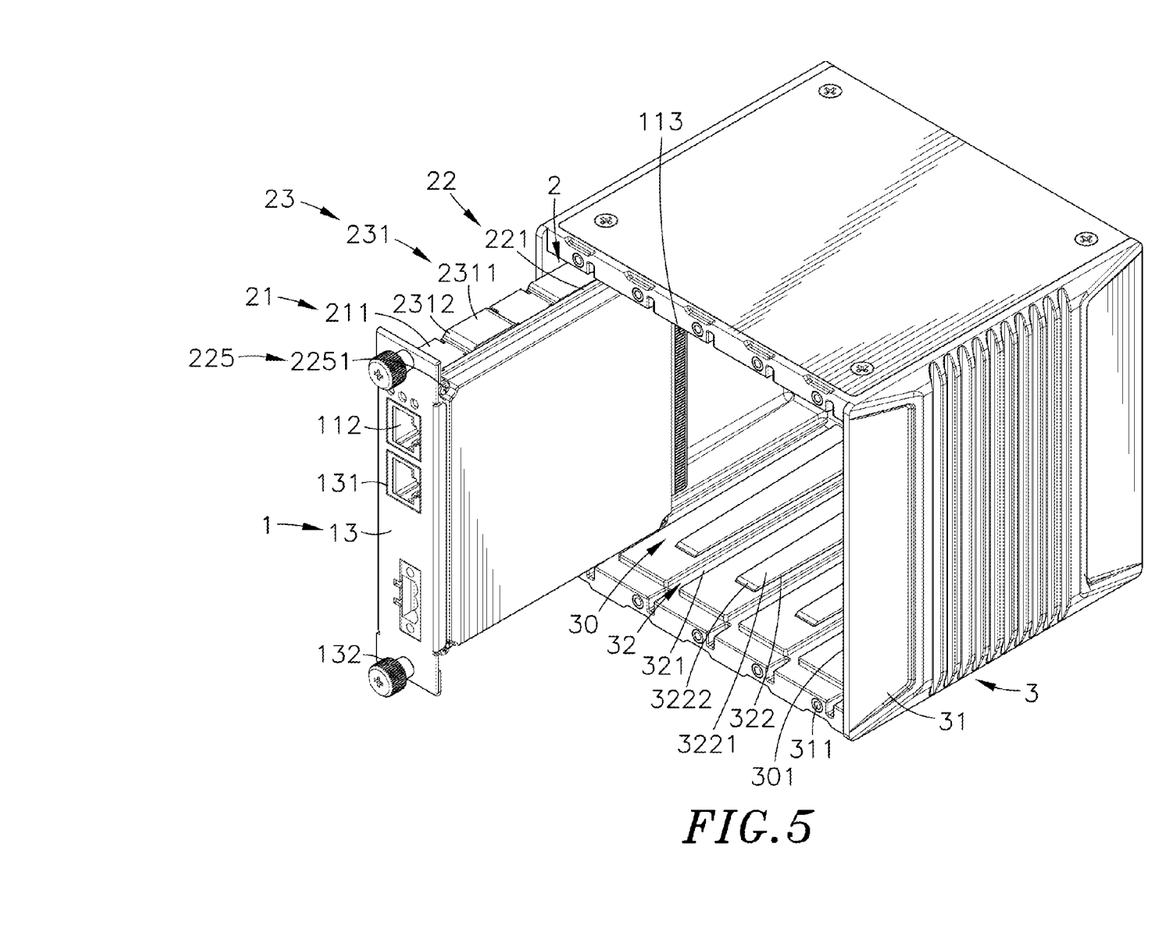
FIG. 5 is an elevational view of the preferred embodiment of the present disclosure, illustrating the circuit module inserting into the cooler bracket.

During assembly of the circuit module 1 and the positioning structure 2 of the present disclosure, the sliding edges 221 of the track members 22 at top and bottom sides of the outer shell member 21 are used to cover the copper foil layers 12 at top and bottom sides of the circuit board 11 corresponding thereto, and the copper foil layers 12 of the circuit board 11 are slid along the sliding slots 222 of the sliding edge 221, and the outer shell member 21 is pushed to inwardly move relative to the circuit board 11 to make the circuit board 11 be positioned and received inside the accommodation open chamber 20. After the punches 224 of the lugs 223 are aligned with the mounting holes 121 of the copper foil layer 12, the screws 2251 of the fixing element 225 are penetrated through the punches 224 and mounting holes 121 respectively to be screwed into the nuts 2252 and locked with the nuts 2252 integrally, so that the circuit board 11 can be fastened in the outer shell member 21 and prohibited from falling out of the outer shell member 21, and the stable combination of the outer shell member 21 and the circuit board 11 can be ensured. In addition, each copper foil layer 12 is abutted with the inner sidewall of the sliding edge 221 of the track member 22 to form the thermal conducting path. The panel 13 can be combined at the front part of the circuit board 11 by above described manner of screw locking, and the panel 13 and the circuit board 11 are arranged with right angle. The ports 112 on the circuit board 11 are mounted into the hollow parts 131 of the panel 13 and exposed to the outside. In addition, other side surface of the circuit board 11 opposite to the outer shell member 21 can be combined with other metal shell member (not shown in FIGs) by the manner of screw locking.

Figure 7:
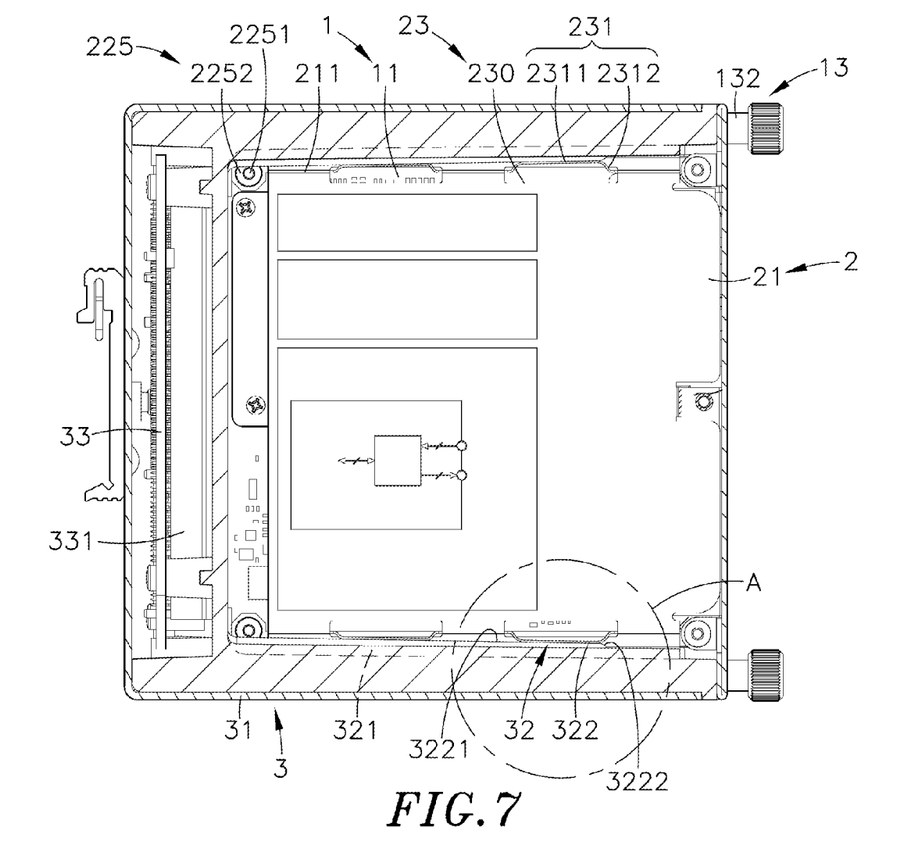
FIG. 7 is a sectional side view of the preferred embodiment of the present disclosure, illustrating the circuit module inserted into the cooler bracket already.
Figure 8:
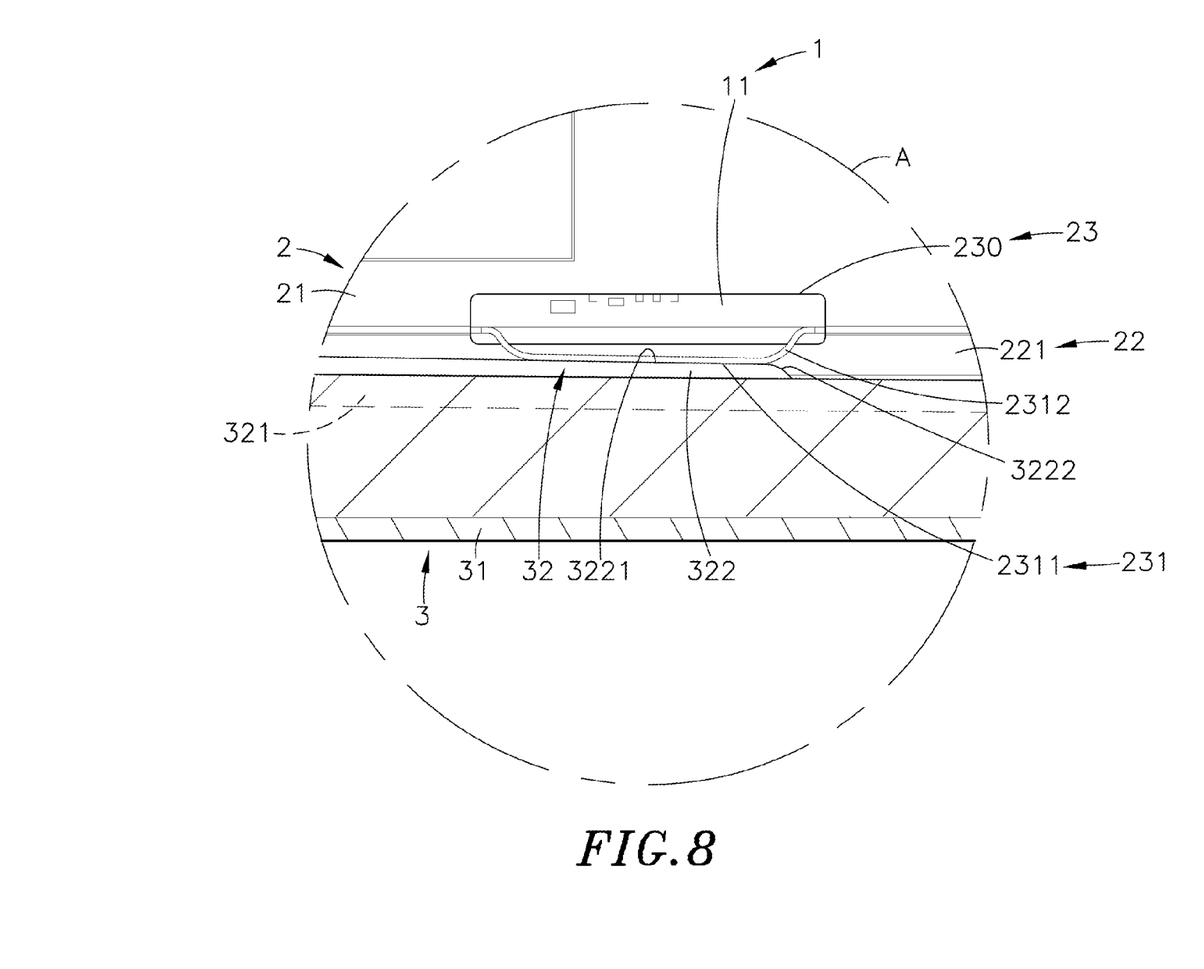
FIG. 8 is a partial enlarged view of the FIG. 7.

Please referring to FIG. 5 through FIG. 8 which show elevational view and sectional side view while the circuit module is inserting into the cooler module, and a sectional side view after the circuit module is inserted into the cooler module already, and a partial enlarged view of the FIG. 7, respectively. As shown in FIG. 5 through FIG. 8, during the assembly of the circuit module 1 with the positioning structure 2 and the cooler bracket 3, the sliding edges 221 of the track members 22 at top and bottom sides of the outer shell member 21 are slidably mounted along the corresponding track slots 321 of the mounting parts 32, and the spring clips 231 of the elastic convex parts 23 will be abutted against the stop blocks 322 respectively, and the top surface 2311 of the spring clip 231 is slid to the contact surface 3221 of the stop block 322 via the chamfer 3222 and elastically deformed inwardly, so an about 0.1 mm of predetermined constraint value is formed between the spring clip 231 and the stop block 322 after the outer shell member 21 is inserted into the cooler bracket 3 to be fastened. Alternatively, the top surfaces 2311 of the spring clips 231 can be directly abutted with the inner sidewalls of the docking chamber 30 of the main body 31. In shaping process, in order to separate the workpiece from the mold more easily, a certain allowance (such as a draft angle) is often reserved between the workpiece and a die parting face of the mold, so the elastic convex parts 23 abutted with the track members 22 of the cooler bracket 3 can form tight contacts to facilitate heat conduction. Therefore, the multiple sets of the circuit modules 1 cooperating with the positioning structures 2 can be sequentially inserted into the docking chamber 30 of the cooler bracket 3 by above described assembly manner, so as to be arranged in parallel, and the insertion part 113 of the circuit board 11 are matedly connected to the corresponding connection element 331 of the wire board 33 electrically. At this time, the top and bottom sides of each of the panels 13 are abutted with the peripheral surface of the opening 301 of the main body 31, the manual screw 132 can be screwed into the thread hole 311 of the main body 31 to be fastened with the main body 31 integrally, so as to prevent the circuit module 1 and the positioning structure 2 from falling out of the cooler bracket 3 to be damaged while the cooler bracket 3 is impacted by an external force.

The heat generated by the heat source 111 of the circuit module 1 in operation can be conducted to the copper foil layers 12 via the metal interlayers inside the circuit board 11, and the heat of the copper foil layers 12 is then conducted to the mounting part 32 of the cooler bracket 3 via the sliding edges 221 and the elastic convex parts 23 of the track member 22 of the positioning structure 2, so as to form the thermal conducting path. Therefore, the cooler bracket 3 can increase entire heat dissipation area and conduct the accumulated heat of the heat source 111 of the circuit board 11 to the positioning structure 2 and the cooler bracket 3 for heat dissipation. According to the thermal test, the 20° C. of heat can be conducted and a nice heat dissipation effect can be provided. The amount of heat of the circuit module 1 to be conducted by the positioning structure 2 cooperating with the cooler bracket 3 primarily depends on the type of material, to improve the heat dissipation efficiency for the heat source 111 and maintain normal operation of the system. In addition, through the copper foil layers 12 of the circuit board 11, the noise interfere such as EMI, static and crosstalk, generated during operation of the circuit module 1 can be transmitted to the cooler bracket 3 for being discharged to the ground, so that the quality of overall signal transmission can further be more steady.

When the circuit module 1 cooperating with the positioning structure 2 are assembled into the docking chamber 30 of the cooler bracket 3, the copper foil layer 12 of the circuit board 11 is covered by the bent structure of the sliding edge 221 of the track member 22, so that the structural strength of the circuit board 11 can be enhanced and the circuit module 1 can be protected from being deformed or damaged in structure thereof during the repeated plugging connection. By such a way that the sliding edge 221 of the track member 22 is in cooperation with the corresponding mounting part 32 of the cooler bracket 3 to be guided and constrained, the circuit module 1 can be assembled in the docking chamber 30 of the cooler bracket 3 stably. By means of covering the heat source 111 and other electronic components of the circuit board 11, the positioning structure 2 can protect all heat sources 111 and electronic components on the circuit board 11. It is hard to limit the strength and direction of user's force applied for the plugging connection of the circuit module 1, the positioning structure 2 can be used to prevent multiple sets of circuit modules 1 from being damaged or broken because of being impacted with each other. Therefore, the present disclosure has nice practicability.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What the invention claimed is:

1. A thermal conducting structure applied to a network control automation system, comprising a circuit module, a positioning structure and a cooler bracket;

said circuit module comprising a circuit board and at least one heat source disposed on said circuit board, and said circuit board defining bare copper regions disposed at two opposite side ends thereof, and copper foil layers disposed on said bare copper regions and configured for conducting heat generated during operation of said at least one heat source;

said positioning structure comprising an outer shell member which has opposite side panels respectively disposed at two opposite lateral sides thereof, and each of said side panels defining a track member which has a sliding edge to cover said copper foil layer for forming a thermal conducting path, an accommodation open chamber formed between said outer shell member and side panels thereof to receive and position said circuit board therein, and each of said two side panels of said outer shell member defining at least one elastic convex part on a surface thereof;

said cooler bracket comprising a main body, a docking chamber formed inside said main body and having an opening at a front part thereof, a plurality of mounting part formed at two opposite lateral sidewalls of said docking chamber, wherein when said circuit module cooperating with said positioning structure are inserted into said docking chamber through said opening, said sliding edge of said track member is slidably mounted into said mounting part, and the elastic convex parts of said outer shell member are abutted with said sidewalls of said docking chamber around said mounting parts to form the thermal conducting path.

2. The thermal conducting structure as claimed in claim 1, wherein said heat generated during operation of said at least one heat source of said circuit module is conducted to said copper foil layers via said circuit board through said thermal conducting path, and said at least one heat source is a FPGA chip, a CPU, a chip set or an image processor.

3. The thermal conducting structure as claimed in claim 1, wherein said circuit board of said circuit module comprises a plurality of ports and a panel disposed at a front part thereof, said panel defines a plurality of hollow parts cut therethrough to mount and expose said plurality of ports, and each of said ports is a power connector or network connector, so that said circuit module is a network interface card matching with Ethernet-network-based fieldbus technology.

4. The thermal conducting structure as claimed in claim 3, wherein said circuit board of said circuit module comprises an insertion part located at rear end thereof, a wire board is disposed at rear end of said docking chamber of said cooler bracket, and at least one connection part is disposed on a surface of said wire board to be electrically connected with said insertion part.

5. The thermal conducting structure as claimed in claim 3, wherein said panel of said circuit module comprises manual screws disposed on top and bottom sides thereof, and said main body of said cooler bracket has a plurality of thread holes disposed at top and bottom sides of a peripheral surface of said opening and arranged in intervals, and said manual screws are respectively screwed into the plurality of thread holes for fastening.

6. The thermal conducting structure as claimed in claim 1, wherein said track member of said positioning structure comprises a sliding edge which is formed by being outwardly extended first and then bent inwardly, and said sliding edge defines a sliding slot extend along a horizontal direction, and said copper foil layers of said circuit module are slidably mounted and abutted with said sliding slot.

7. The thermal conducting structure as claimed in claim 6, wherein said copper foil layers of said circuit module define a plurality of mounting holes cut therethrough and located at corners of said circuit board respectively, each of said sliding edges of said track members of said positioning structure defines lugs located at openings of front and rear ends of said sliding slot respectively and outwardly extended, each of said lugs has a punches, and fixing elements are respectively penetrated through said mounting holes and said punches respectively, so as to combine said circuit module and said positioning structure integrally.

8. The thermal conducting structure as claimed in claim 1, wherein said elastic convex part of said positioning structure is an arch spring clip which has a top surface thereon, and said mounting parts of said cooler bracket respectively define track slots for being mounted with said sliding edges of said track members of said positioning structure, and stop blocks are disposed on sidewalls of said docking chamber around each two opposite track slots respectively and abutted with said top surfaces to make spring clips have elastic deformation.

9. The thermal conducting structure as claimed in claim 8, wherein each of said spring clips of said elastic convex parts of said positioning structure defines connection parts located at front and rear sides of said top surface and adjacent to said side panel, and has a cut hole cut through left and right lateral sides thereof.

10. The thermal conducting structure as claimed in claim 8, wherein said stop block of said mounting part of said cooler bracket has a low-to-high smooth contact surface for being abutted with said spring clip to form said thermal conducting path, and said contact surface defines a chamfer at a front part thereof and adjacent to said opening.

* * * * *